United States Patent [19]
Chapman et al.

[11] 3,980,915
[45] Sept. 14, 1976

[54] METAL-SEMICONDUCTOR DIODE INFRARED DETECTOR HAVING SEMI-TRANSPARENT ELECTRODE

[75] Inventors: Richard A. Chapman, Dallas; Milo R. Johnson, Richardson; Henry B. Morris, Plano, all of Tex.

[73] Assignee: Texas Instruments Incorporated, Dallas, Tex.

[22] Filed: Feb. 27, 1974

[21] Appl. No.: 446,185

[52] U.S. Cl. ............................. 313/101; 313/366
[51] Int. Cl.² .................. H01J 39/02; H01J 29/45
[58] Field of Search ............ 313/84, 101, 102, 367, 313/366, 392, 391

[56] References Cited
UNITED STATES PATENTS

| | | | |
|---|---|---|---|
| 3,415,680 | 12/1968 | Perri et al. | 357/54 X |
| 3,564,309 | 2/1971 | Hoeberechts et al. | 313/367 |
| 3,696,262 | 10/1972 | Antypas | 313/94 |
| 3,743,899 | 7/1973 | Berth et al. | 313/366 X |
| 3,757,123 | 9/1973 | Archer et al. | 250/338 |
| 3,778,657 | 12/1973 | Kubo et al. | 313/367 |
| 3,783,324 | 1/1974 | Wronski et al. | 313/94 X |
| 3,786,294 | 1/1974 | Wilson et al. | 313/367 |

FOREIGN PATENTS OR APPLICATIONS

| | | | |
|---|---|---|---|
| 898,876 | 4/1972 | Canada | 313/366 |
| 1,239,893 | 7/1971 | United Kingdom | 313/94 |

OTHER PUBLICATIONS

Calawa et al, "Crystal Growth, Annealing, and Diffusion of Lead–Tin Chalcogenides;" Transactions of the Metallurgical Society of AIME; vol. 242; Mar., 1968; pp. 374–383.

Primary Examiner—Robert Segal
Attorney, Agent, or Firm—Harold Levine; James T. Comfort; William E. Hiller

[57] ABSTRACT

This disclosure is directed to a photovoltaic detector having specific response to the infrared range, wherein the detector comprises a metal-semiconductor diode having a semi-transparent electrode and disposed on a specially prepared substrate of a narrow band gap semiconductor material or on an epitaxial layer or evaporated film of such material provided on a substrate. In a specific example, the narrow band gap semiconductor material of the substrate is specially prepared (Pb,Sn)Te or an epitaxial layer or evaporated film of (Pb,Sn)Te on a (Pb,Sn)Te substrate. The detected radiation is transmitted through the semi-transparent electrode on top of the photovoltaic detector.

19 Claims, 7 Drawing Figures

METAL-SEMICONDUCTOR DIODE INFRARED DETECTOR HAVING SEMI-TRANSPARENT ELECTRODE

This invention relates to a photovoltaic detector having specific response to the infrared range, wherein the detector comprises a metal-semiconductor diode having a semi-transparent electrode, and to an array of such detectors for providing target signals to enable an object emitting infrared radiation to be identified when located in an area scanned by the array of detectors as contemplated herein. The infrared radiation to be detected is transmitted through the semi-transparent electrodes on top of the individual detectors included in the array.

A typical procedure for fabricating infrared detectors from semiconductor material involves the diffusion of impurities into a substrate of semiconductor material to form P-N junction diodes, particularly in the lead-salt compounds and III-V semiconductor compounds. Such techniques suffer in that they are generally relatively expensive and time-consuming, while providing relatively low yields of operable detectors which frequently offer less than optimum performance. Generally, the less than satisfactory detector performance associated with such techniques heretofore employed can be traced to the inability to control the diffusion process in the semiconductor materials to the degree required for optimum results of the detector diodes. Photoconductor detectors made from some materials, such as (Hg, Cd)Te, also suffer from high cost, low yield processing.

A major problem associated with the fabrication of infrared detectors is the necessity to reduce the majority carrier concentration to a sufficiently low level for eliminating the "Burstein Shift" which can cause the photoresponse to cut off at a shorter wavelength than would otherwise be available. The Burstein Shift if present will cause an infrared detector to substantially fail to respond to the presence of long wavelengths within the infrared spectrum. This adverse effect holds true for both photovoltaic (Pb,Sn)Te and photoconductive (Kg,Cd)Te infrared detectors and becomes increasingly serious for semiconductors having small energy band gaps (long wavelength). The Burstein Shift is substantially eliminated by use of a low carrier concentration, typically obtained heretofore in infrared detectors by annealing the upper surface region of the substrate or by providing an epitaxial layer thereon having a low carrier concentration.

Zero bias differential resistance is another factor to be considered in the performance of photovoltaic infrared detectors. Zero bias resistance may be defined as the incremental resistance of a diode detector current-voltage characteristic at 0 volts. A low zero bias resistance would tend to cause an unsatisfactorily low signal to noise ratio, thereby limiting the effectiveness of the detectivity obtainable from a diode detector. Thus, within the limits of frequency response required by an array of infrared detectors, it is desirable to maintain as high a 0 bias resistance as possible.

In accordance with the present invention, an infrared detector diode is provided of a completely different character from those heretofore employed by constructing the detector as a metal-semiconductor diode having a semi-transparent electrode. The metal-semiconductor diode is disposed on a specially prepared substrate of a pseudobinary alloy or a narrow band gap semiconductor material, or alternatively on an epitaxial layer or evaporated film of such materials provided on a substrate. The infrared radiation to be detected is transmitted through the semi-transparent electrode of the diode detector. The metal-semiconductor diode detector having the semi-transparent electrode can be produced at low cost through a process offering high yield, inasmuch as impurity diffusion heretofore employed in conventional detector processing is eliminated, thereby resulting in simple, fast, and economical processing. The technique employed in producing the metal-semiconductor diode detector having the semi-transparent electrode in accordance with the present invention also reduces handling, further enhancing the yield and operating performance, particularly where materials are employed that would damage easily. The metal-semiconductor diode detector as constructed in accordance with the present invention has a high signal-noise ratio at low frequencies with negligible $1/f$ noise in contrast to photoconductive detectors which characteristically suffer from noise problems at low frequencies.

In a more specific aspect of the present invention, a metal-semiconductor diode detector is provided in which a semi-transparent electrode of indium having a thickness in the range of 100–500A is disposed on an epitaxial layer, evaporated film, or an annealed surface region of a substrate of $Pb_{1-x}Sn_xTe$ material within a window formed in an insulation layer. The semi-transparent electrode is effective to transmit infrared radiation to be detected therethrough. The operating performance of the metal-semiconductor diode detector according to this invention may lead one to conclude that a P-N junction is formed by diffusion of metal atoms from the semi-transparent electrode into the epitaxial layer, evaporated film, or annealed surface region of the $Pb_{1-x}Sn_xTe$ substrate. However, it has been determined that the diffusion potential is greater than the band gap potential of the material which is evidence that a metal-semiconductor barrier or Schottky barrier is present rather than a P-N junction.

Other features of the invention will be more fully understood from the following more detailed description as set forth in the specification when taken together with the accompanying drawings in which.

Figure 1:
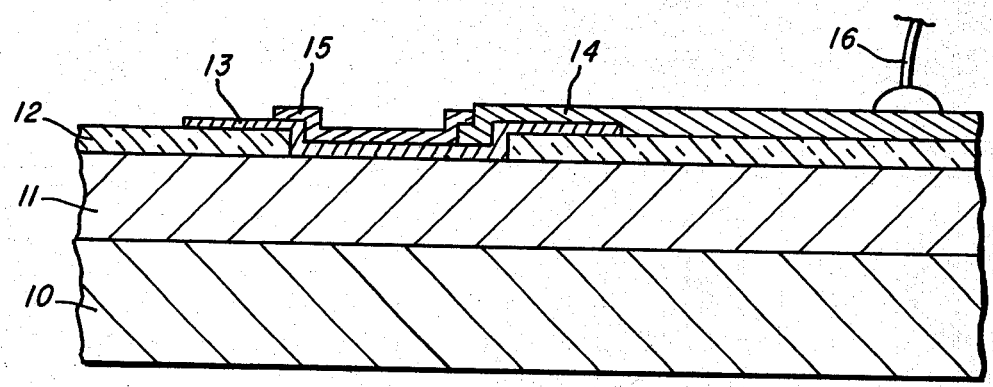
FIG. 1 is a cross-sectional view of a metal-semiconductor diode infrared detector constructed in accordance with the present invention.

Referring more specifically to the drawings, FIG. 1 illustrates a metal-semiconductor diode infrared detector as constructed in accordance with the present invention. The metal-semiconductor diode detector contemplated herein has specific response to the infrared range and may be characterized as a detector device in which no dopant diffusion is employed for the purpose of providing a P-N junction. Instead, the metal-semiconductor diode detector herein described offers evidence of a Schottky barrier effect. In FIG. 1, a substrate 10 of semiconductor material is provided which is suitable for signal production responsive to infrared radiation impinging thereon. While the preferred material of the semiconductor substrate 10 is $Pb_{1-x}Sn_xTe$, it will be understood that any suitable pseudobinary alloy or semiconductor material offering a narrow band gap may be employed, examples of which are $Hg_{1-x}Cd_xTe$, and $InAs_{1-x}Sb_x$.

By varying the relative percentages of the chemical elements included in a suitable pseudobinary alloy or semiconductor material employed as the substrate 10, the response of the resulting detector can be tailored to a specific wavelength range within a wider range of wavelengths extending from 3–14 microns. For example, the preferred substrate material may be $Pb_{0.79}Sn_{0.21}Te$, with the detector made therefrom responding to wavelengths over a wavelength range of 8 microns to a value in excess of 11 microns.

In a preferred embodiment, the substrate 10 is provided with an upper surface region 11 extending thereacross which may be formed by an annealing procedure, or as an epitaxial layer or evaporated film of the same material as the substrate.

Where the substrate 10 is $Pb_{1-x}Sn_xTe$ material, annealing typically is performed on a surface thereof in the presence of a metalrich (Pb, Sn, Te) powder with excess lead and tin of approximately 1% as compared to the tellurium, the annealing being accomplished by subjecting the substrate 10 to a heat treatment under such conditions over a predetermined time. When treated in this manner, the $Pb_{1-x}Sn_xTe$ substrate is caused to have an annealed upper surface region 11 of the order of approximately 100 microns in thickness. The upper surface region 11 of the $Pb_{1-x}Sn_xTe$ substrate 10 may be so annealed as to exhibit either n-type or p-type conductivity. Annealing procedures suitable for this purpose are described in the article "Crystal Growth, Annealing, and Diffusion of Lead-Tin Chalcogenides" — Calawa et al, appearing in Transactions of the Metallurgical Society of AIME, Vol. 242, pp. 374–383 (Mar. 1968).

Instead of being formed by annealing, as noted previously the surface region 11 of the semiconductor substrate 10 may be provided by depositing an epitaxial layer on the substrate 10 in a suitable manner, such as by employing vapor deposition or evaporating a thin film thereon in the well known manner. In the latter instance, the epitaxial layer or evaporated thin film is deposited so as to have a low carrier concentration which may be either p-type or n-type conductivity as noted. Use of an epitaxial layer or an evaporated thin film rather than the annealed surface region for the layer 11 of the substrate 10 has the added advantage in that the procedure can be accomplished much sooner than the annealing procedure, as for example, in less than one day as compared to 5–30 days for annealing.

A layer of insulating material 12 is then formed on the upper surface region 11 of the substrate 10. The insulating layer 12 may be provided by photoresist material, such as KMER. Photographic techniques are employed for providing windows in the photoresist layer 12, which are developed in the well known manner to expose selected portions of the upper surface region 11 therebeneath. The photoresist material of the layer 12 may be cured or otherwise polymerized by appropriate techniques, such as the technique described in U.S. Pat. No. 3,402,073 Pierce et al issued Sept. 17, 1968, wherein the photoresist material is permanently converted to insulating material to remain in place as the insulation layer 12. It will be understood that the insulating layer 12 may be formed of other suitable materials, such as silicon oxide, aluminum oxide, and silicon nitride, wherein appropriate openings would be etched therein to expose selected portions of the upper surface region 11 of the substrate 10 therebeneath.

In accordance with the present invention, the opening in the insulating layer 12 is partially filled with a relatively thin layer of metal 13 which is deposited therein to form a metal-semiconductor diode with the upper surface region 11 of the substrate 10. To this end, the thin metal layer 13 is deposited to a thickness preferably on the order of 100–500A thick and is sufficiently thin to be semi-transparent to infrared radiation, the metal layer 13 thereby comprising a semi-transparent electrode. Where the upper surface region 11 of the substrate 10 is of p-type conductivity, it is preferred that the semi-transparent electrode 13 be formed of a metal having a low work function, such as for example, indium. Where the upper surface region 11 of the substrate 10 is of n-type conductivity, it is preferred to form the semi-transparent electrode 13 of a metal having a high work function, such as for example, platinum. The term "work function" as understood in the art is defined as the minimum energy required to take an electron from a metal element of the Periodic Table into vacuum at a temperature of absolute zero.

Completing the metal-semiconductor diode infrared detector of FIG. 1, a thick layer of metal 14 is deposited so as to overlie the insulating layer 12 and a portion of the semi-transparent electrode 13 to form an expanded contact. Preferably, a coating of a suitable material, such as ZnS, or $As_2S_3$, for example, is deposited atop the remaining portion of the semi-transparent electrode 13 disposed within the opening in the insulating layer 12 to serve as an anti-reflection coating 15. The dimensions of the thick metal expanded contact 14 enable external conductors in the form of jumper wires to be ballbonded thereto, therebeing a jumper wire 16 ball-bonded to the expanded contact 14 in the metal-semiconductor diode structure illustrated in FIG. 1.

Figure 2:
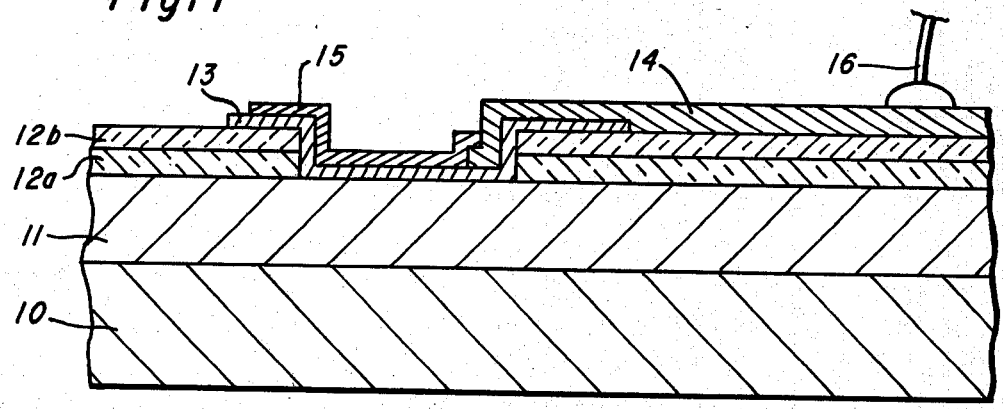
FIG. 2 is a cross-sectional view similar to FIG. 1, but showing another embodiment of the metal-semiconductor diode infrared detector.

FIG. 2 illustrates another embodiment of the metal-semiconductor diode infrared detector as constructed in accordance with the present invention. In the embodiment of FIG. 2, like reference numerals have been applied to identify structural components having identical counterparts in the embodiment of FIG. 1. The detector structure of FIG. 2 differs from the embodiment of FIG. 1 in providing a composite insulating layer which includes a first insulating layer 12a deposited upon the upper surface region 11 of the substrate 10 and a second insulating layer 12b disposed atop the first insulating layer 12a. The opening through the composite insulating layer in which the semi-transparent electrode 13 is disposed extends through the upper and lower insulating layers 12b and 12a respectively to expose a selected portion of the upper surface region 11 of the substrate 10. The lower insulating layer 12a is of surface passivating insulation material, suitable examples of which include BaF$_2$, silicon oxide, aluminum oxide, and silicon nitride. The upper insulating layer 12b serves in the nature of a shock absorbing layer or buffer to cushion the effect of vibrations which may be imparted to the thick metal expanded contact 14 in bonding a jumper wire 16 thereto. In this respect, the upper insulating layer 12b cushions the effect of such shocks to prevent damage to the diode detector structure. Preferably, the upper insulating layer 12b is formed of photoresist material which has been suitably polymerized to provide a permanent insulation layer, such as for example by the technique described in the aforesaid U.S. Pat. No. 3,402,073.

(Pb,Sn)Te, the preferred material of the substrate and upper surface region thereof for the metal-semiconductor diode infrared detector as constructed in accordance with this invention is relatively soft and easily damaged. Typically, diffused junction processing heretofore employed in making infrared diode detectors has involved high temperature processing and repeated handling of this material, tending to degrade its quality. The use of the cushioning or buffer layer 12b of the composite insulating layer in the embodiment of FIG. 2 further tends to protect the (Pb,Sn)Te substrate from damage.

Figure 3:
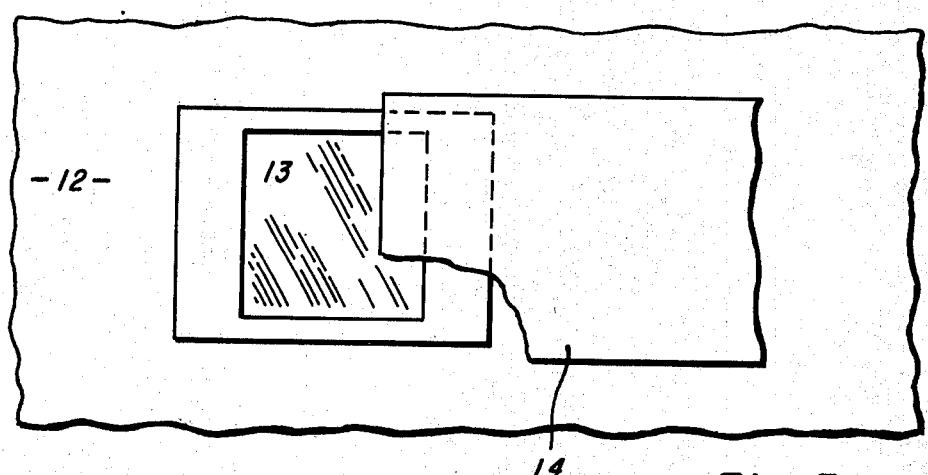
FIG. 3 is a top plan view of the metal-semiconductor diode infrared detector shown in FIG. 1, with the anti-reflection coating removed for purposes of clarity.
Figure 4:
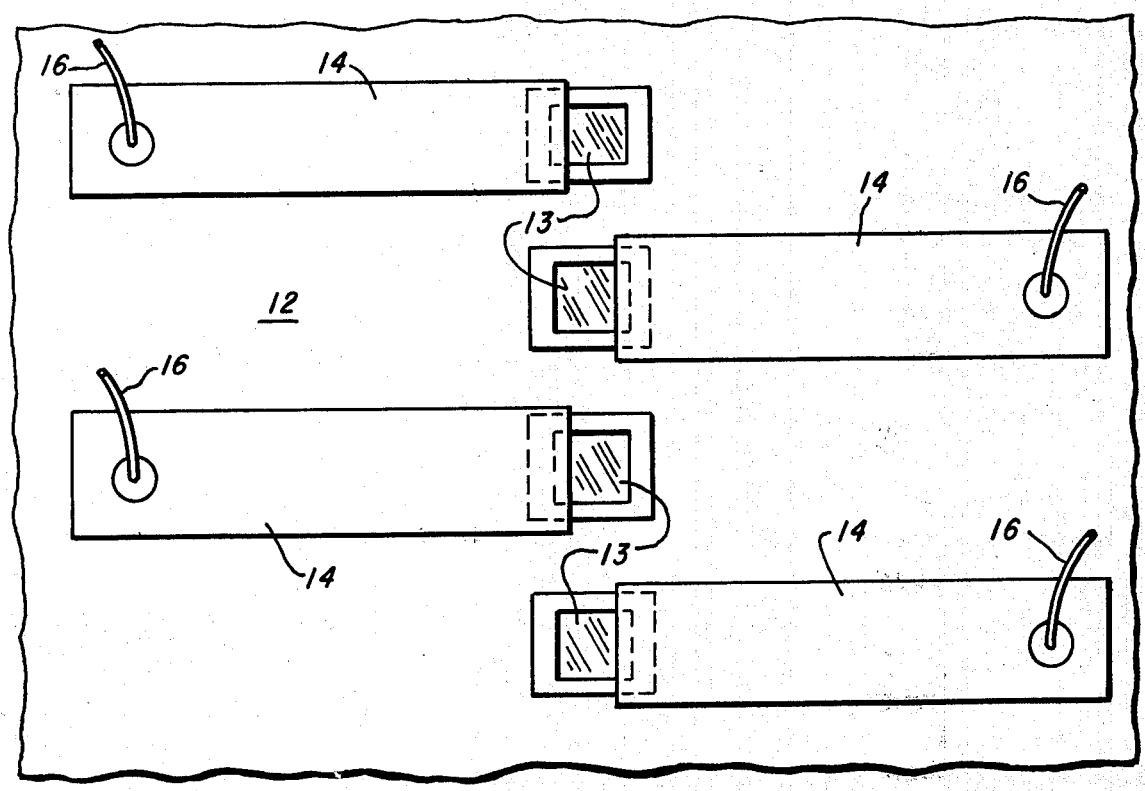
FIG. 4 is a top plan view showing a portion of a infrared detector array employing a plurality of metal-semiconductor diode infrared detectors according to FIG. 1.

Referring to FIG. 3, it will be observed that the opening formed in the insulating layer 12 of the embodiment of FIG. 1 or the composite insulating layer including the upper and lower insulating layers 12b and 12a of FIG. 2 assumes a generally square configuration in area. However, other geometries may be adopted for the opening, such as rectangular or circular, for example, within the spirit of the invention. FIG. 4 depicts a section of a multi-detector array in which the individual diode detectors are arranged in respective columns, wherein individual detectors in a respective column are positioned in staggered relationship with respect to individual detectors in an adjacent column, with the semi-transparent electrodes of the detectors in the pair of successive columns being disposed in registration to define respective dots on a scan line in the multi-detector array.

The formation of the semi-transparent thin film electrode 13 with the proper selection of carrier concentration for narrow band gap semiconductor materials is essential to the metal-semiconductor diode detector structure contemplated herein. It is extremely important to obtain maximum transmission of infrared signal radiation through the semi-transparent electrode 13 which cooperates with the underlying active upper surface region 11 of the substrate 10 to form a Schottky barrier diode detector. In the case of detectors whose performance approaches that maximum set by radiation background noise, the signal received by the Schottky barrier diode detector as constructed in accordance with this invention will be directly proportional to the transmissivity of the semi-transparent electrode 13 and the detectivity D* (figure of merit) will be directly proportional to the square root of the transmissivity of the semi-transparent electrode 13. Thus, the metal of the electrode 13 and its thickness should be chosen so as to approach transparency for transmitting all radiation therethrough, or at least to avoid absorption of any radiation so that the only loss (or gain) will be due to a decrease (or increase) in reflectance caused by the application of the metal layer comprising the electrode 13 to the upper surface region 11 of the substrate 10. It is contemplated herein that a radiation absorption characteristic ranging from 10–20% of the total incident light on the electrode 13 can be tolerated in many applications for an infrared detector without sacrificing operating performance to any significant degree. For example, where indium is used as the material of the semi-transparent electrode 13, it has been determined that a thickness of the order of 500A of indium can be used with satisfactory detector signal and detectivity being obtained. Where the operating performance of a detector with an indium semi-transparent electrode 13 has less stringent demands, thicknesses of the order of 1,000A of indium may be employed for the electrode 13 with degradation in detector performance. For even greater thicknesses of indium for the electrode 13, the radiation transmission of the electrode 13 will decrease exponentially as the thickness increases, and the detector performance will quickly become unsatisfactory. Lead may be used in place of indium for the material of the semi-transparent electrode 13 when the upper surface region 11 of the substrate 10 is of p-type conductivity. Other metals can be used as the material of the semi-transparent electrode 13 (depending upon the conductivity type of the upper surface region 11 of the substrate 10), but a metal layer comprising electrode 13 should not exceed a thickness of the order of 1000A and preferably should be on the order of 100–500A thick. Accordingly, the term "semi-transparent" as employed herein with reference to the electrode 13 is intended to relate to the ability of the metal layer comprising the electrode 13 to transmit a portion of the radiation incident thereon as opposed to being opaque to such incident radiation, i.e. absorbing all of such incident radiation.

Figure 6:
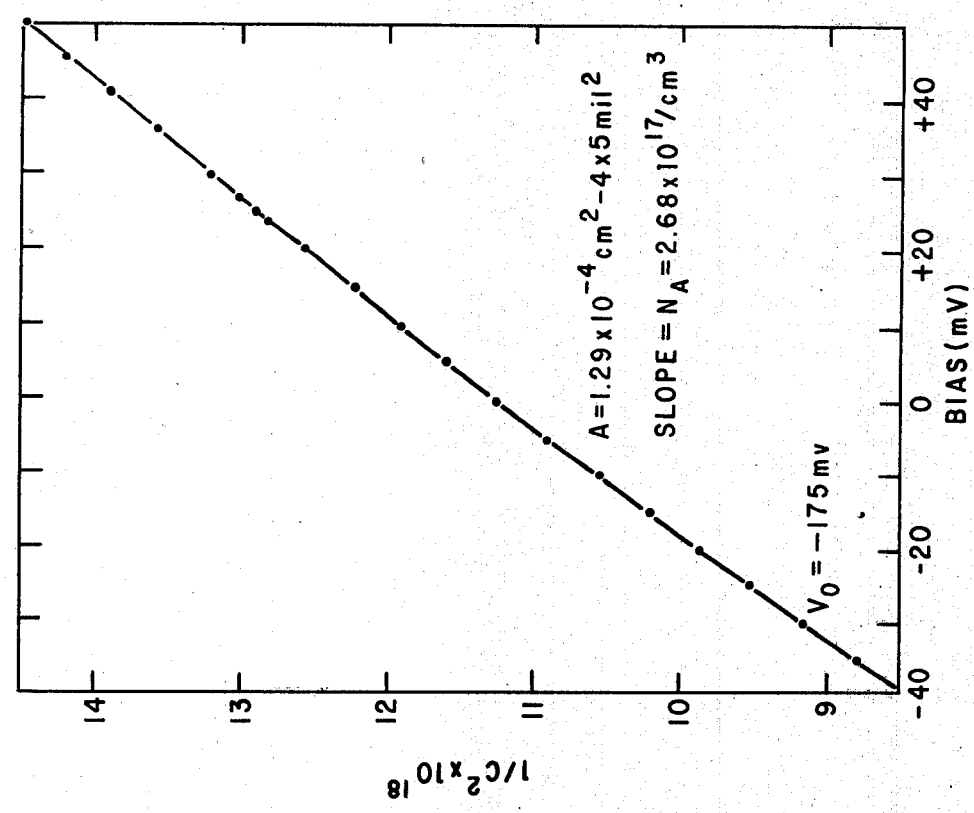
FIG. 6 is a graph of 1/capacitance$^2$ vs. bias voltage for a metal semi-conductor diode detector included in an array of such diode detectors.
Figure 5:
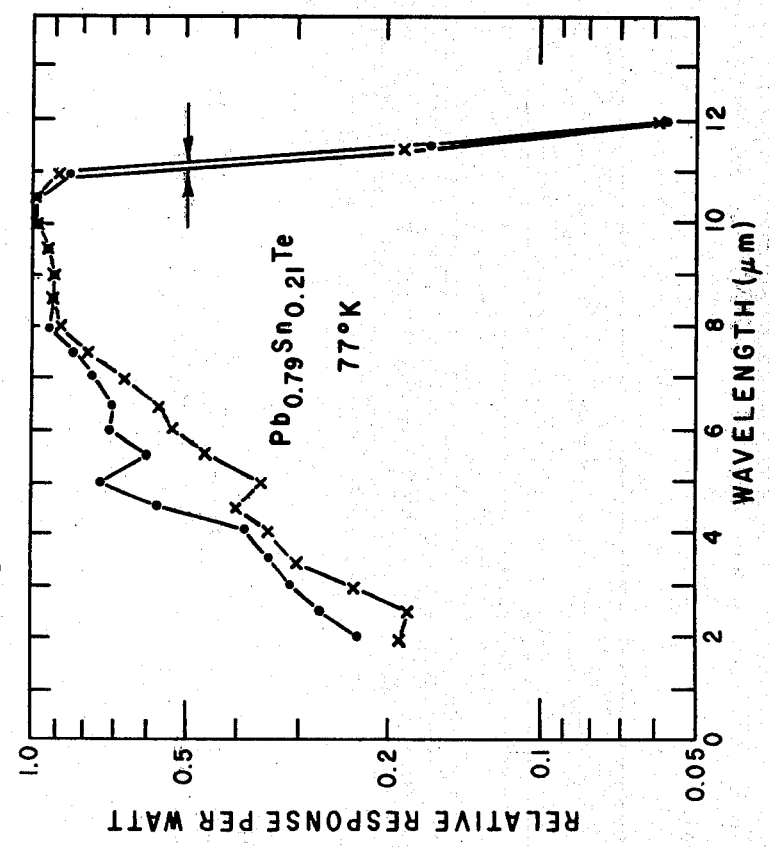
FIG. 5 is a graph of relative spectral response per watt vs. wavelength in microns of a pair of metal-semiconductor diode infrared detectors constructed in accordance with the present invention, as employed in a multi-detector array mounted on (Pb,Sn)Te substrate material.
Figure 7:
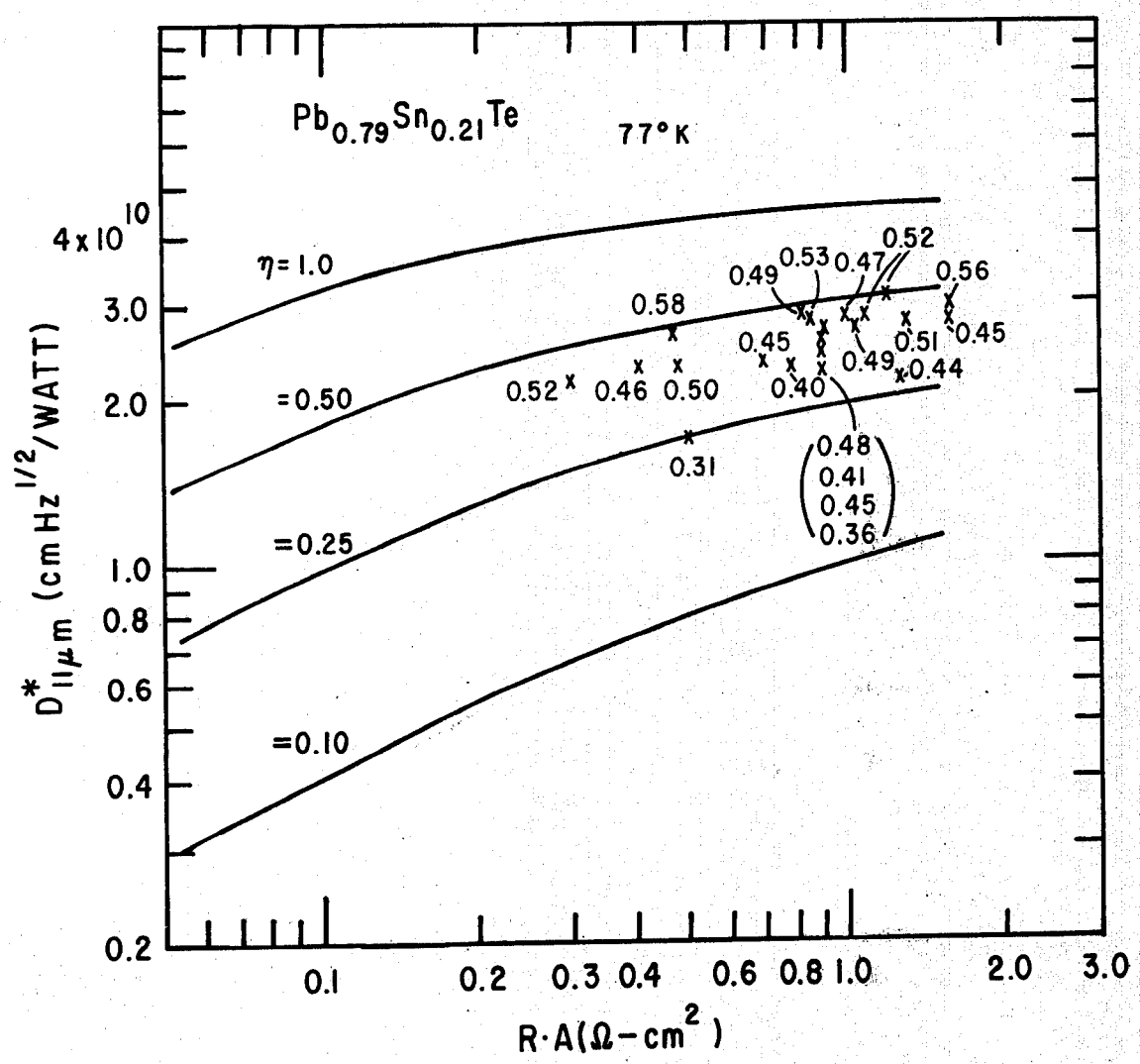
FIG. 7 is a graph plotting D* (detectivity) vs. R.A (resistance X area) of a multiple number of metal-semiconductor diode infrared detectors constructed in accordance with the present invention and included in an array.

The provision of this semi-transparent electrode 13 in the diode detector structure enables relatively high resistance X area (hereinafter R·A) products of metal-semiconductor diodes to be used to advantage. FIGS. 5–7 are respective graphs showing data for a metal-semiconductor diode detector array in which the respective diodes are provided with semi-transparent electrodes as fabricated on a Pb$_{.79}$Sn$_{.21}$Te substrate which has been annealed. In FIG. 5, the spectral response per watt for two diode detectors as constructed in accordance with the present invention in a multi-detector array is given, showing an excellent response of the two detectors over a wavelength range of 8 microns to a value in excess of 11 microns. This performance effectively demonstrates the absence of a Burstein Shift in the diode detectors which were tested. In FIG. 6, 1/(Capacitance)$^2$ is plotted vs bias voltage for a metal-semiconductor diode as constructed in accordance with the present invention, indicating a straight line relationship having a slope determinative of the carrier concentration which is calculated to be 2.68 × 10$^{17}$/cm$^3$.

The graph of FIG. 7 compares detectivity or D* as a figure of merit vs. R·A which relates to resistance with quantum efficiency $\eta$ as a parameter. The respective diode detectors included in the multidetector array being tested show performance values having quantum efficiencies of the order of 50% which is comparable to the results obtainable from the use of infrared diode detectors having P-N junctions as produced by conventional impurity diffusion techniques.

By way of a particular example, a metal-semiconductor diode detector having a semi-transparent electrode in accordance with the present invention was fabricated from a p-type $(Pb_{.79}Sn_{.21})Te$ substrate having $2 \times 10^{19}$ carriers/cm$^3$, the material being tellurium-rich and of 0.5 millimeters thickness. The substrate was annealed in a quartz ampoule which had been evacuated and back-filled with hydrogen gas, the annealing being carried out in the presence of metal-rich powder containing Pb, Sn, and Te with an excess of Pb and Sn over Te of approximately 1%. The annealing was carried out in three stages, the first stage involving heating the substrate to 700°C for 24 hours followed by a second stage, wherein the substrate was heated to 600°C for a period of 10 days and a third stage at 550°C for 20 days. The annealed substrate was then subjected to mechanical lapping and polishing, followed by chemical polishing on both sides thereof to a mirror surface using a solution of 1–2% bromine added to 48% HBr acid. A layer of platinum was then deposited on the unannealed surface of the substrate to establish an ohmic contact therewith. The substrate was then affixed to a copper support member by soldering the platinum-plated side thereof to the copper support member with indium. The annealed side of the substrate was then polished by chemical polishing using the same solution of bromine and HBr acid. Thereafter, a layer of photoresist material was applied to the polished surface of the substrate and cured by heating to 100°C. A window was opened in the photoresist layer by photographic techniques, following which further baking of the structure at 100°C occurred to complete the curing of the photoresist layer. A metallization stencil was then applied in registration with the opening through the photoresist layer, and a thin indium layer was vacuum deposited within the opening so as to partially overlap the photoresist layer bounding the opening. Deposition of the indium layer continued until it had achieved a thickness of 200A while the substrate was maintained at approximately room temperature such that the indium layer so formed comprised a semi-transparent electrode. A second metallization stencil was then applied to the substrate for effecting a pattern to form the expanded contact. An expanded contact of indium was then vacuum deposited in the pattern defined by the metallization stencil to a thickness of approximately 15,000A or 1.5 microns. Gold jumper wire was then ball-bonded by thermal compression to the expanded contact of indium. It was determined that the detector had a detectivity D* at 11 microns of $3.0 \times 10^{10}$ cm Hz$^{1/2}$/watt with a zero bias resistance of 27,000 ohms and a peak response at 10.5 microns. The detector had a 50% cut-off at a wavelength greater than 11.25 microns and its quantum efficiency was calculated to be 49% which reached the theoretical quantum efficiency value of 49%, thereby reflecting a highly favorable operational performance.

While this invention has been described with particular reference to a detector formed on an active region of a substrate wherein the active region and the substrate are formed of the same material, it is within the spirit of the invention to form the active region of a different material from that of the substrate. Additionally, the active region may comprise the whole substrate. In the latter respect, the substrate may be formed as a homogeneous body having a low majority carrier concentration within a specified limit to avoid the occurrence of the Burstein Shift while maintaining a relatively high zero bias resistance when provided with the semi-transparent electrode in forming the Schottky barrier diode detector. Suitable materials as homogeneous substrate bodies include $Hg_{1-x}Cd_xTe$ (in particular $Hg_{0.80}Cd_{0.20}Te$) and InSb, in addition to $Pb_{1-x}Sn_xTe$.

Thus, it will be seen that a high performance, low cost infrared detector has been provided by employing a metal-semiconductor diode having a semi-transparent electrode. The metal-semiconductor diode comprises a photovoltaic detector operated at substantially zero external voltage bias. By metal-semiconductor diode as contemplated herein, it should be understood that it is within the spirit of this invention to include (1) a Schottky barrier diode, (2) a Schottky barrier diode which includes a thin dielectric film at the metal-semiconductor interface thin enough to permit tunnelling, (3) a metal-semiconductor diode in which a fraction of the potential barrier is introduced by chemical processing; i.e., conductivity type inversion, (4) a metal-semiconductor diode incorporating two or more metals or their oxides, and (5) a tunnel Schottky diode.

Although preferred embodiments of the invention have been specifically described, it will be understood that the invention is to be limited only by the appended claims, since variations and modifications of the preferred embodiments will be apparent to those skilled in the art.

What is claimed is:

1. A metal-semiconductor diode infrared detector comprising:
    a body of narrow band gap semiconductor material,
    insulating layer means disposed on said body,
    said insulating layer means being provided with at least one opening therethrough exposing a selected portion of said body,
    a relatively thin metal layer disposed in said opening in contact with and covering the selected portion of said body to form a metal-semiconductor diode therewith, said relatively thin metal layer being at least partially transparent to infrared radiation and comprising a semi-transparent electrode, and
    electrical conductor means connected to said semi-transparent electrode.

2. An infrared detector as set forth in claim 1, wherein said body comprises a substrate of homogeneous semiconductor material.

3. An infrared detector as set forth in claim 1, further including a substrate, and said body comprising an upper surface region provided on said substrate.

4. An infrared detector as set forth in claim 3, wherein said substrate and said body are made of the same semiconductor material.

5. An infrared detector as set forth in claim 3, wherein said substrate and said body are made of different materials.

6. A metal-semiconductor diode infrared detector comprising:
    a substrate of narrow band gap semiconductor material, said substrate being provided with an upper surface region having a relatively low carrier concentration as compared to the remainder of said substrate, insulating layer means disposed on said upper surface region of said substrate, said insulating layer means being provided with at least one opening therethrough exposing a selected portion of said upper surface region of said substrate, a relatively thin metal layer disposed in said opening in contact with and covering the selected portion of said upper surface region of said substrate to form a metal-semiconductor diode therewith, said relatively thin metal layer being at least partially transparent to infrared radiation and comprising a semi-transparent electrode, and electrical conductor means connected to said semi-transparent electrode.

7. An infrared detector as set forth in claim 6, wherein said substrate includes as the upper surface region thereof an annealed layer having a lower carrier concentration as compared to the remainder of said substrate.

8. An infrared detector as set forth in claim 6, wherein said upper surface region of said substrate is an epitaxial layer of the same material as said substrate and having a lower carrier concentration as compared thereto.

9. An infrared detector as set forth in claim 6, further including an anti-reflection coating disposed atop the portion of said semi-transparent electrode located in the opening formed in said insulating layer means.

10. An infrared detector as set forth in claim 6, wherein said insulating layer means comprises a first layer of surface passivating insulating material disposed in contacting engagement with said upper surface region of said substrate and a second upper insulating layer disposed above said first insulating layer, said upper insulating layer supporting portions of said semi-transparent electrode bounding said opening in said insulating layer means and said electrical conductor means to serve as a shock absorbing cushion.

11. An infrared detector as set forth in claim 6, wherein said substrate and said upper surface region thereof are made of a semiconductor material taken from the group consisting of $Pb_{1-x}Sn_xTe$, $Hg_{1-x}Cd_xTe$, and $InAs_{1-x}Sb_x$.

12. An infrared detector as set forth in claim 11, wherein said substrate and said upper surface region thereof are $Pb_{1-x}Sn_xTe$.

13. An infrared detector as set forth in claim 12, wherein said $Pb_{1-x}Sn_xTe$ material of said substrate and said upper surface region are of p-type conductivity, and said semi-transparent electrode is made of indium.

14. An infrared detector as set forth in claim 13, wherein said semi-transparent indium electrode has a thickness in the range of 100–500A.

15. An infrared detector as set forth in claim 12, wherein said $Pb_{1-x}Sn_xTe$ material of said substrate and said upper surface region thereof are of n-type conductivity, and said semi-transparent electrode is made of platinum.

16. An infrared detector as set forth in claim 15, wherein said semi-transparent platinum electrode has a thickness in the range of 100–500A.

17. An infrared detector as set forth in claim 6, wherein said metal-semiconductor diode is a photovoltaic detector operable at substantially zero external voltage bias.

18. An infrared detector as set forth in claim 2, wherein said substrate of homogeneous semiconductor material is made of a semiconductor material taken from the group consisting of $Pb_{1-x}Sn_xTe$, $Hg_{1-x}Cd_xTe$, and InSb.

19. An infrared detector as set forth in claim 6, wherein said substrate and said upper surface region are of p-type conductivity, and said semi-transparent electrode is made of lead.

* * * * *